US010861711B1

(12) United States Patent
 Chiu (10) Patent No.: US 10,861,711 B1
(45) Date of Patent: Dec. 8, 2020

(54) METHOD OF MANUFACTURING A SEMICONDUCTOR STRUCTURE

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/660,824

(22) Filed: Oct. 23, 2019

(51) Int. Cl.
 *H01L 21/768* (2006.01)
 *H01L 23/00* (2006.01)
 *H01L 21/48* (2006.01)

(52) U.S. Cl.
 CPC ...... *H01L 21/4853* (2013.01); *H01L 21/7688* (2013.01); *H01L 24/11* (2013.01); *H01L 24/14* (2013.01); *H01L 2224/11472* (2013.01); *H01L 2224/11903* (2013.01); *H01L 2224/11906* (2013.01); *H01L 2224/11912* (2013.01); *H01L 2224/13017* (2013.01); *H01L 2224/94* (2013.01)

(58) Field of Classification Search
 CPC ..... H01L 24/11; H01L 24/14; H01L 21/4853; H01L 21/7688; H01L 2224/1147; H01L 2224/11472; H01L 2224/11474; H01L 2224/1148; H01L 2224/11912; H01L 2224/11914; H01L 2224/11902; H01L 2224/11903; H01L 2224/11001; H01L 2224/11005; H01L 2224/13017; H01L 2224/13006; H01L 2224/93; H01L 2224/94; H01L 2224/119; H01L 2224/11906
 See application file for complete search history.

(56) References Cited

U.S. PATENT DOCUMENTS

| 5,565,379 | A  | * | 10/1996 | Baba | H01L 24/11 438/614 |
| 8,765,593 | B2 | * | 7/2014 | Ayotte | H01L 24/14 438/613 |
| 9,773,755 | B2 | * | 9/2017 | Shen | H01L 24/17 |
| 2007/0105359 | A1 | * | 5/2007 | Daubenspeck | H01L 24/11 438/612 |
| 2013/0026624 | A1 | * | 1/2013 | Erwin | H01L 24/03 257/737 |
| 2013/0213702 | A1 | * | 8/2013 | Hsieh | H01L 24/05 174/257 |

* cited by examiner

*Primary Examiner* — Michael M Trinh
(74) *Attorney, Agent, or Firm* — CKC & Partners Co., LLC (57) ABSTRACT

A method of manufacturing a semiconductor structure includes forming a precursor structure including a plurality of conductive pads on a substrate, an etch stop layer between the conductive pads, and an UBM layer on the conductive pads and the etch stop layer. A plurality of mask structures are formed on the UBM layer, and a plurality of openings are formed between thereof. Each of the mask structures is located on one of the conductive pads, and the openings expose a first portion of the UBM layer. A supporting layer is formed in the openings. The mask structures are removed to form a plurality of cavities exposing a second portion of the UBM layer. A conductive material layer is formed in the cavities. The supporting layer is removed. The first portion of the UBM layer is removed to form a plurality of conductive bumps separated from each other.

10 Claims, 10 Drawing Sheets

METHOD OF MANUFACTURING A SEMICONDUCTOR STRUCTURE

BACKGROUND

Field of Invention

The present invention relates to a method of manufacturing a semiconductor structure. More particularly, the present invention relates to a method of manufacturing a semiconductor structure having bumps.

Description of Related Art

In three-dimensional Large Scale Integration (3D LSI) chip stack technology, two or more chips can be stacked vertically and joined with copper pillars and metal bumps. However, a jointing area between the copper pillar and the metal bump is large; therefore a large downforce and high temperature are needed for a thermocompression bump joint process and easily result in cracks and damage of the chips.

SUMMARY

In accordance with an aspect of the present invention, a method of manufacturing a semiconductor structure is provided. The method includes following operations. A precursor structure includes a substrate, a plurality of conductive pads, an etch stop layer, and an UBM layer is formed. The conductive pads are on the substrate. The etch stop layer is between the conductive pads. The UBM layer is on the conductive pads and the etch stop layer. A plurality of mask structures are then formed on the UBM layer, and a plurality of openings are formed between thereof, wherein each of the mask structures is located on one of the conductive pads, and the openings expose a first portion of the UBM layer. A supporting layer is formed in the openings. The mask structures are then removed to form a plurality of cavities exposing a second portion of the UBM layer. A conductive material layer is then formed in the cavities. The supporting layer is then removed. The first portion of the UBM layer is then removed to form a plurality of conductive bumps separated from each other.

According to some embodiments of the present invention, the mask structures include oxide material.

According to some embodiments of the present invention, forming the mask structures includes performing High Density Plasma (HDP) process.

According to some embodiments of the present invention, each of the mask structures has a top width and a bottom width that is greater than the top width.

According to some embodiments of the present invention, each of the mask structures has a sharp end.

According to some embodiments of the present invention, the method further includes removing a top portion of each of the mask structures.

According to some embodiments of the present invention, the supporting layer includes polymer material.

According to some embodiments of the present invention, removing the mask structures includes wet etching process.

According to some embodiments of the present invention, each of the conductive bumps covers one of the conductive pads.

According to some embodiments of the present invention, each of the conductive bumps has a cone shape structure or a pyramid shape structure.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

In order to make the description of the present disclosure more detailed and complete, the following illustratively describes implementation aspects and specific embodiments of the present disclosure; however, this is not the only form in which the specific embodiments of the present disclosure are implemented or utilized. The embodiments disclosed below may be combined with or substituted by each other in an advantageous manner, and other embodiments may be added to an embodiment without further recording or description. In the following description, numerous specific details will be described in detail to enable readers to fully understand the following embodiments. However, the embodiments of the present disclosure may be practiced without these specific details.

Although below using a series of actions or steps described in this method disclosed, but the order of these actions or steps shown should not be construed to limit the present invention. For example, certain actions or steps may be performed in different orders and/or concurrently with other steps. Moreover, not all steps must be performed in order to achieve the depicted embodiment of the present invention. Furthermore, each operation or procedure described herein may contain several sub-steps or actions.

Figure 1:
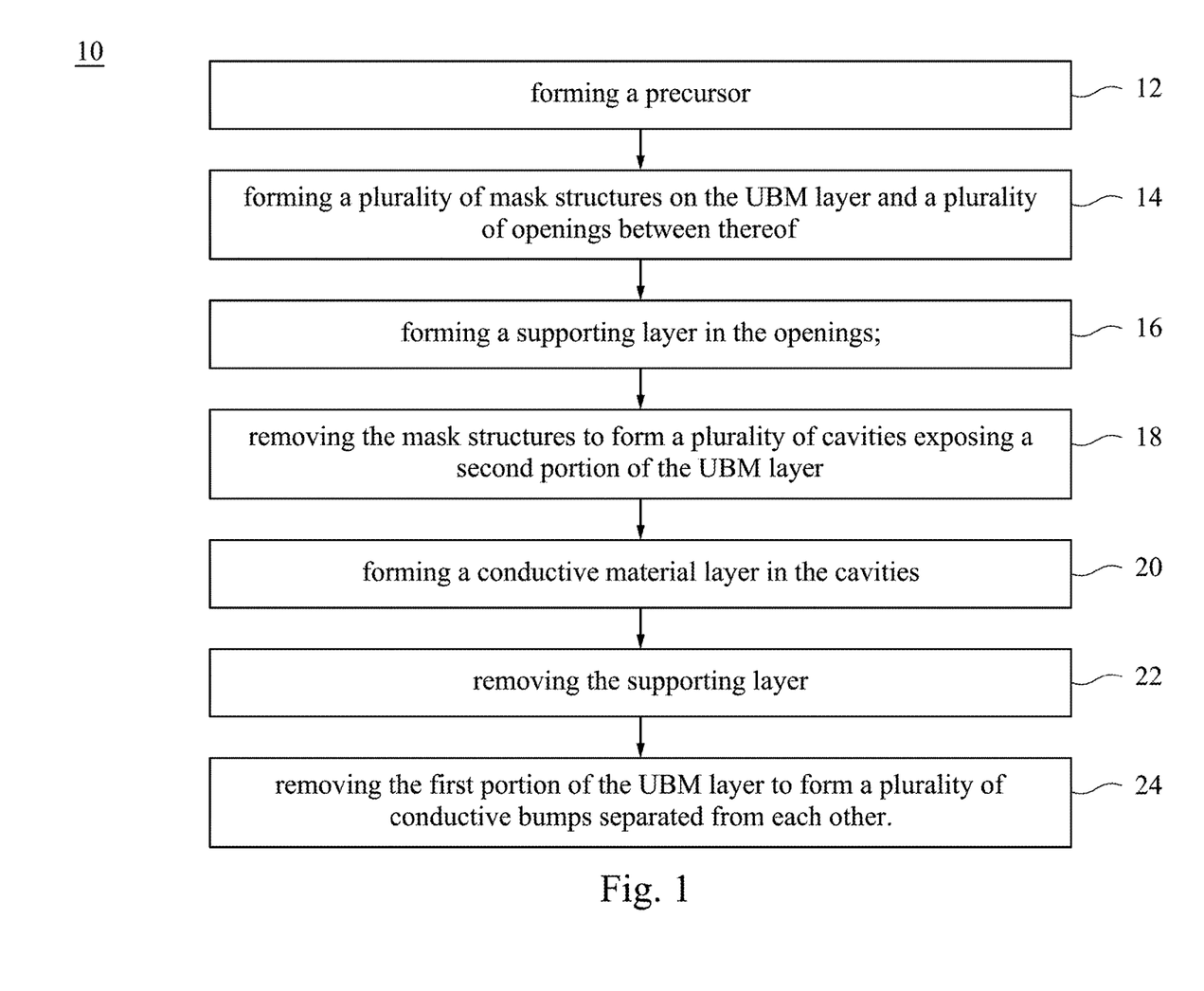
FIG. 1 is a flow chart illustrating a method of manufacturing a semiconductor structure in accordance with some embodiments of this invention.

FIG. 1 is a flow chart illustrating a method of manufacturing a semiconductor structure in accordance with some embodiments of this invention. As shown in FIG. 1, the method 10 includes operation 12, operation 14, operation 16, operation 18, operation 20, operation 22, and operation 24. FIGS. 2-10 are cross-sectional views and top view at various stages of method 10 according to some embodiments of the present disclosure.

Figure 2:
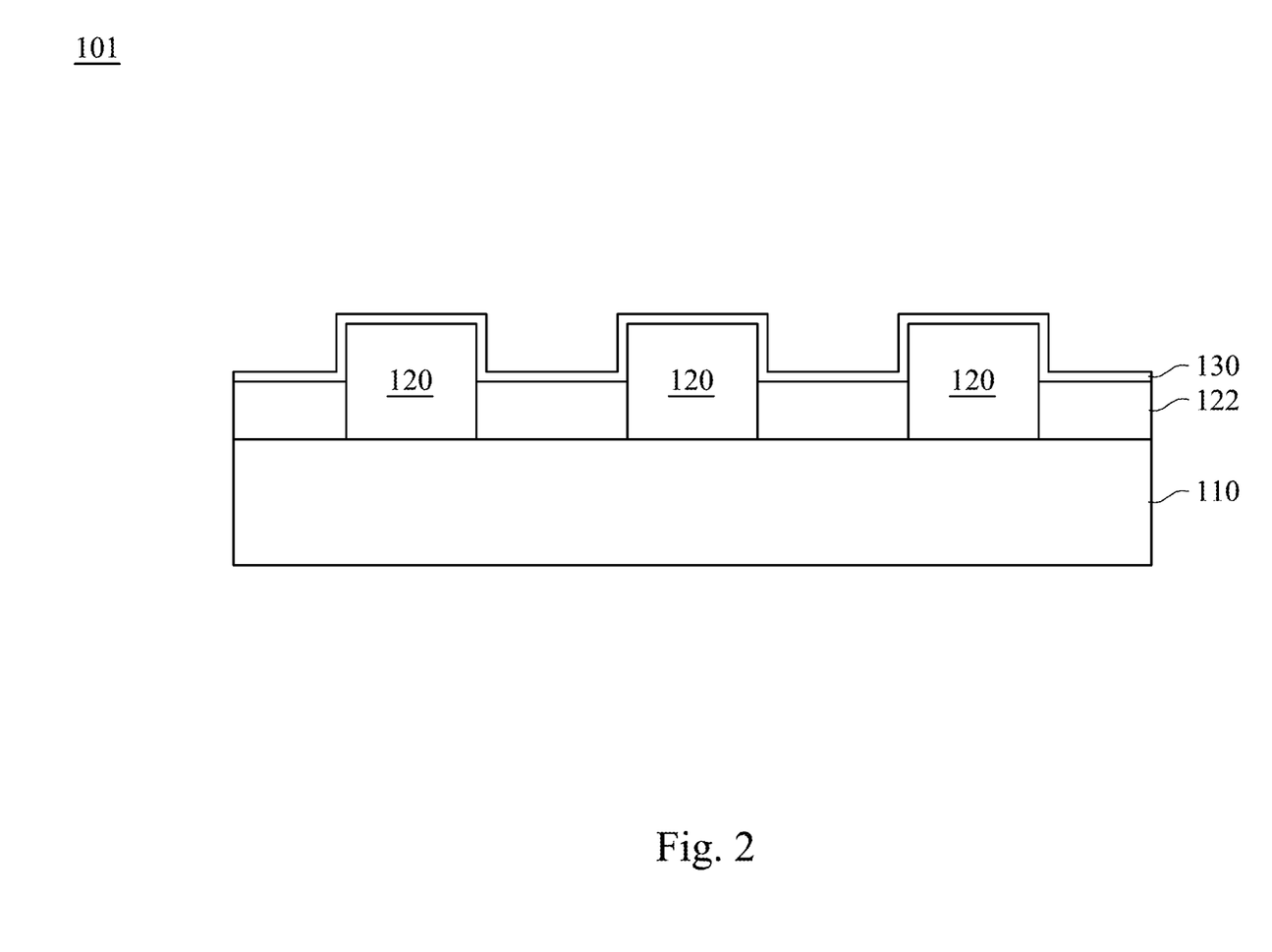
FIG. 2 to FIG. 3 are cross-sectional views of various intermediary stages in the manufacturing of semiconductor structure in accordance with some embodiments of this invention.

Please refer to FIG. 1 and FIG. 2, in the operation 12 of the method 10, a precursor structure 101 is formed. As shown in FIG. 2, the precursor structure 101 includes a substrate 110, a plurality of conductive pads 120, an etch stop layer 122, and an UBM layer 130. In some embodiments, the substrate 110 may be semiconductor substrate, such as a silicon substrate, a silicon germanium substrate, a silicon carbon substrate, an III-V compound semiconductor substrate, or the like. In some embodiments, the substrate 110 may include one or more active device (not shown) such as transistor.

The conductive pads 120 are disposed on the substrate 110. In some embodiments, the conductive pads 120 include metal material. The conductive pads 120 may be formed by suitable deposition and patterning process. The etch stop layer 122 is between the conductive pads 120. In some embodiments, the etch stop layer 122 includes silicon nitride, but is not limited thereto. Specifically, the etch stop layer 122 covers the substrate 110 exposed by the conductive pads 120 and separated the conductive pads 120 from each other. The UBM layer 130 is disposed on the conductive pads 120 and the etch stop layer 122. Specifically, the UBM layer 130 is conformally formed on the conductive pads 120 and the etch stop layer 122. The UBM layer 130 may be a single layer or may include multiple layers. In some embodiments, the UBM layer 130 includes Titanium (Ti)/Copper (Cu), but is not limited thereto. The UBM layer 130 may function as a glue layer for electrochemical deposition.

Figure 3:
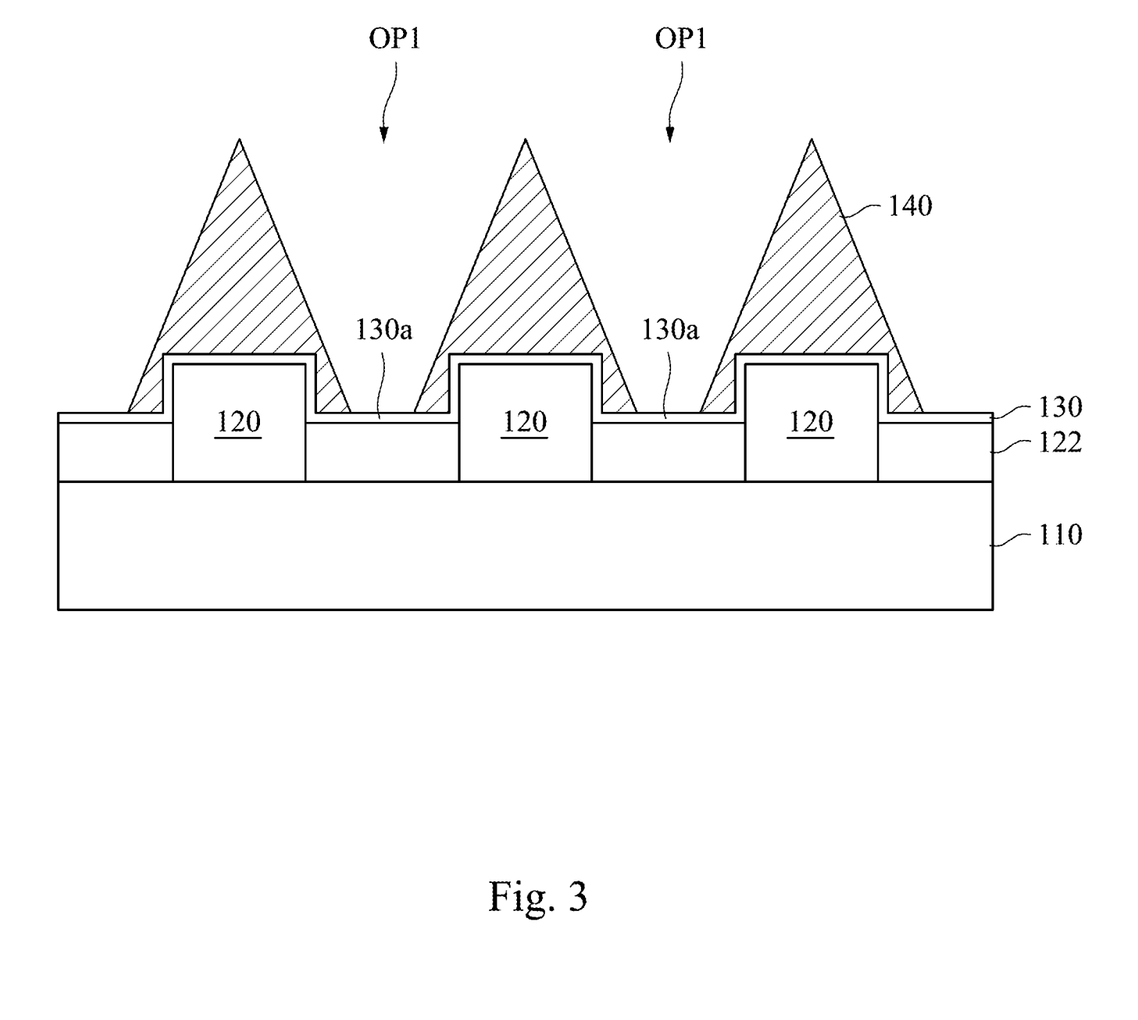
Figure 4:
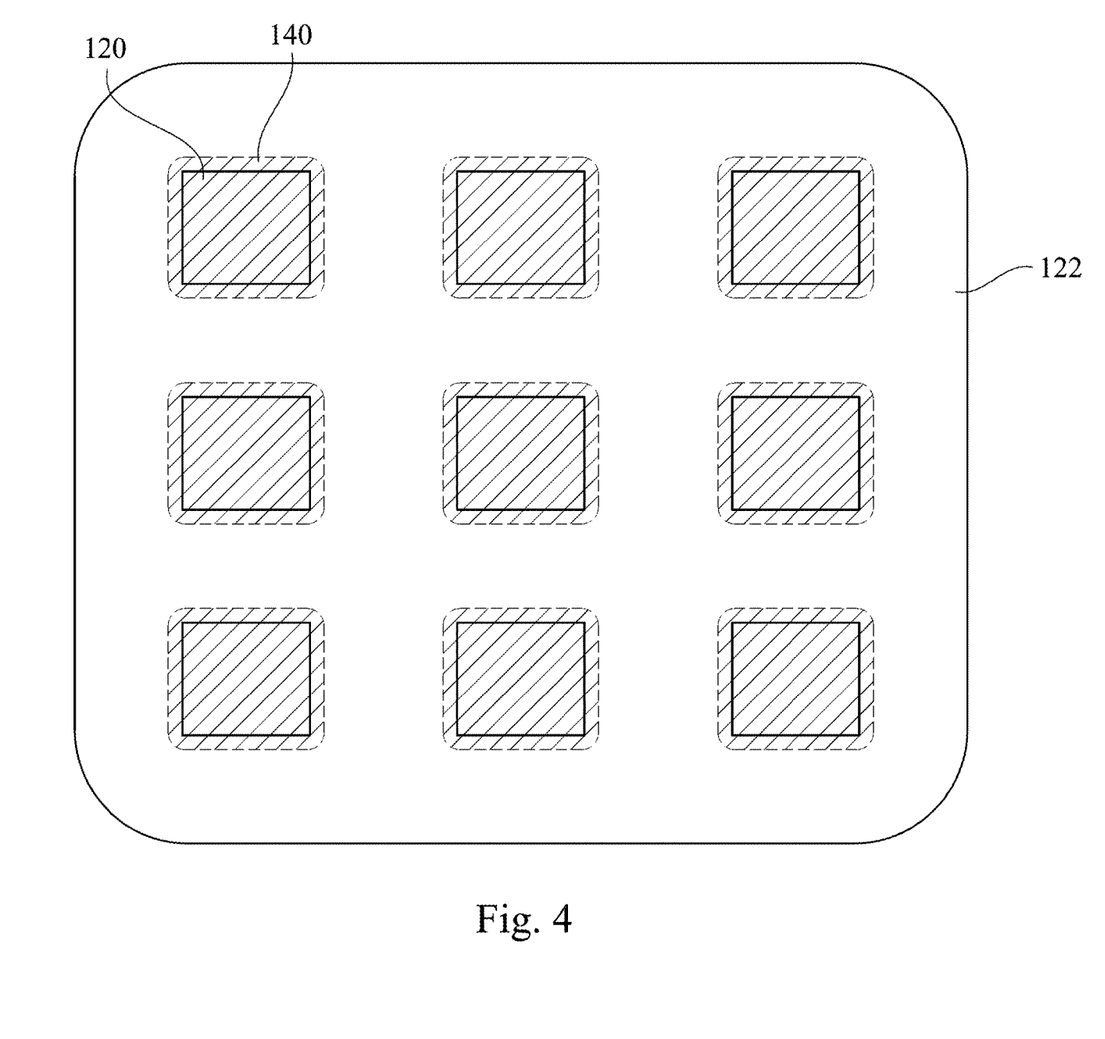
FIG. 4 is a top view of FIG. 3 in accordance with some embodiments of this invention.

Next, please refer to FIG. 1 and FIG. 3, in the operation 14 of the method 10, a plurality of mask structures 140 are formed on the UBM layer 130, and a plurality of openings OP1 are formed between thereof. FIG. 4 is a top view of FIG. 3. The UBM layer 130 is not shown in FIG. 4 for simplifying the drawing. As shown in FIG. 3 and FIG. 4, each of the mask structures 140 is located on one of the conductive pads 120, and the openings OP1 expose a first portion 130a of the UBM layer 130. Specifically, each of the mask structures 140 is an individual structure, and a bottom of each of the mask structures 140 (i.e., the dashed region shown in FIG. 4) covers the corresponding conductive pad 120. Therefore, the first portion 130a of the UBM layer 130 is exposed by the openings OP1 between the mask structures 140. In some embodiments, the mask structures 140 are formed on the UBM layer 130 by performing High Density Plasma (HDP) process. The HDP process includes one or more deposition/etching/deposition process, such that each of the mask structures 140 has a sharp end shown in FIG. 4. In some embodiments, each of the mask structures 140 has a cone shape or a pyramidal shape. In some embodiments, the mask structures 140 include oxide material such as silicon oxide.

Figure 5:
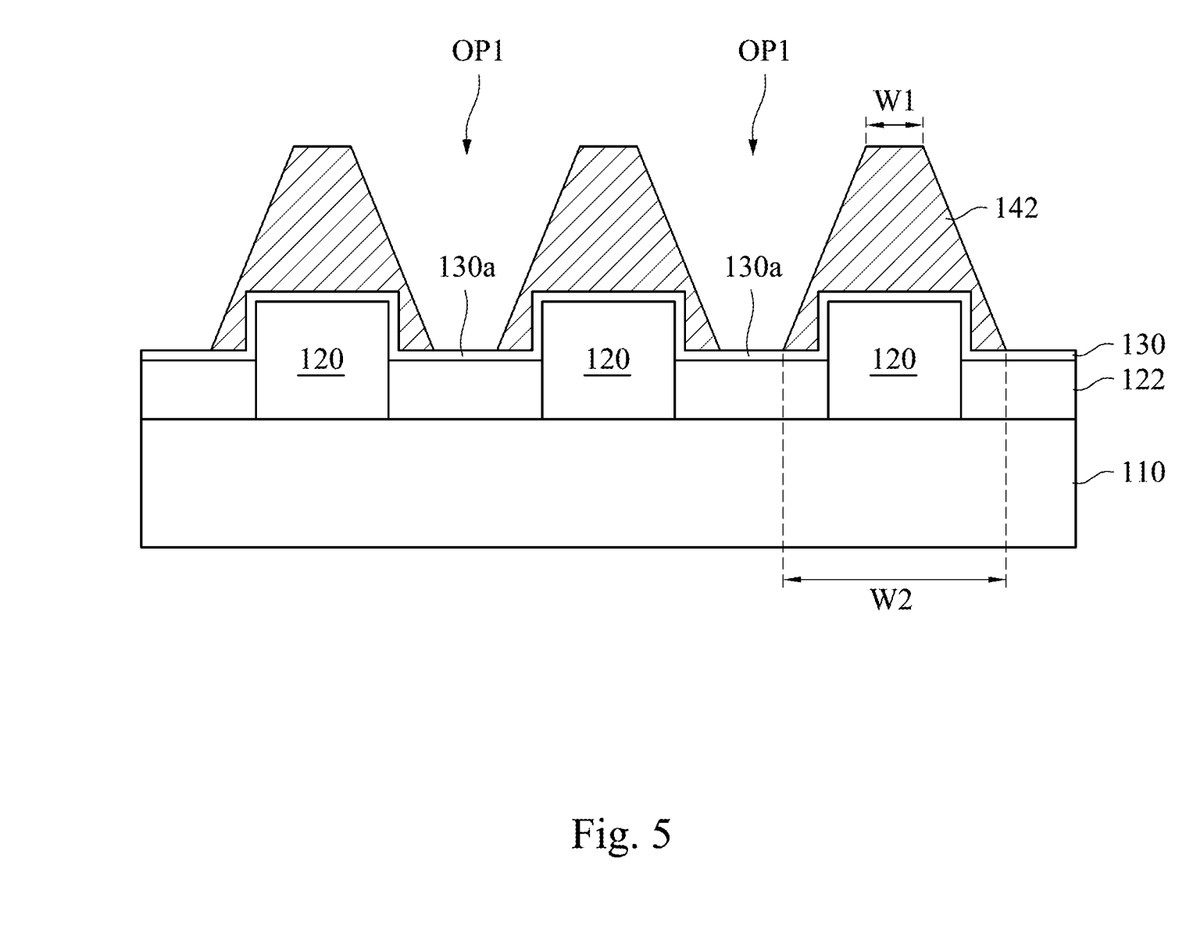
FIG. 5 to FIG. 10 are cross-sectional views of various intermediary stages in the manufacturing of semiconductor structure in accordance with some embodiments of this invention.

Please refer to FIG. 5, in some embodiments, the method 10 further includes removing a top portion of each of the mask structures 140 to form the mask structure 142. In some embodiments, the top portion of each of the mask structures 140 is removed by a chemical mechanical polishing (CMP) process. The mask structures 142 have a top surface area greater than a top surface of the mask structures 140, and therefore removing the mask structures 142 in the subsequent operation is easier. As shown in FIG. 5, each of the mask structures 142 has a top width W1 and a bottom width W2, and the bottom width W2 is greater than the top width W1. That is, the mask structures 142 may have an inclined sidewall.

Figure 6:
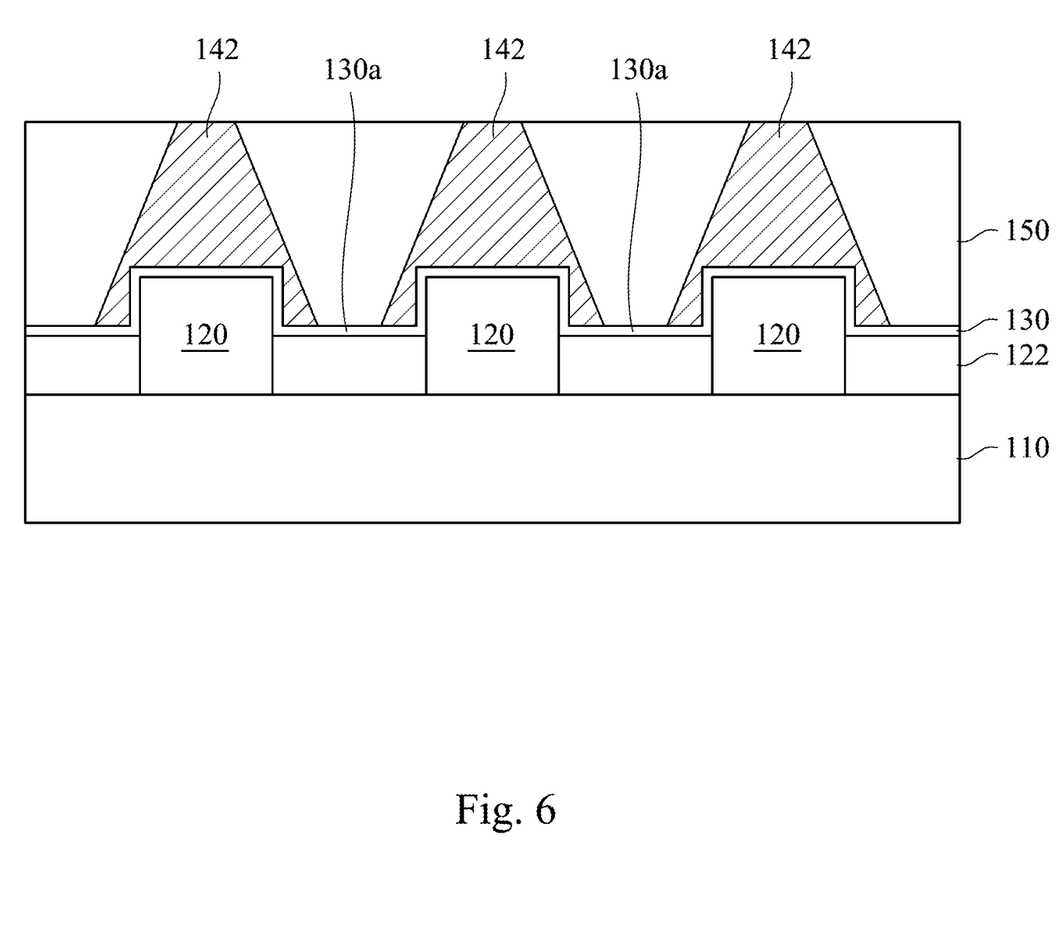

Next, referring to FIG. 1 and FIG. 6, in the operation 16 of the method 10, a supporting layer 150 is formed in the openings OP1. In some embodiments, the supporting layer 150 includes polymer material. In some examples, the supporting layer 150 is polyimide isoindro quindzoline (PIQ). The supporting layer 150 may be formed by coating process to fill the openings OP1. As shown in FIG. 6, the supporting layer 150 fills the openings OP1 between the mask structures 142 and covers the first portion 130a of the UBM layer 130.

Figure 7:
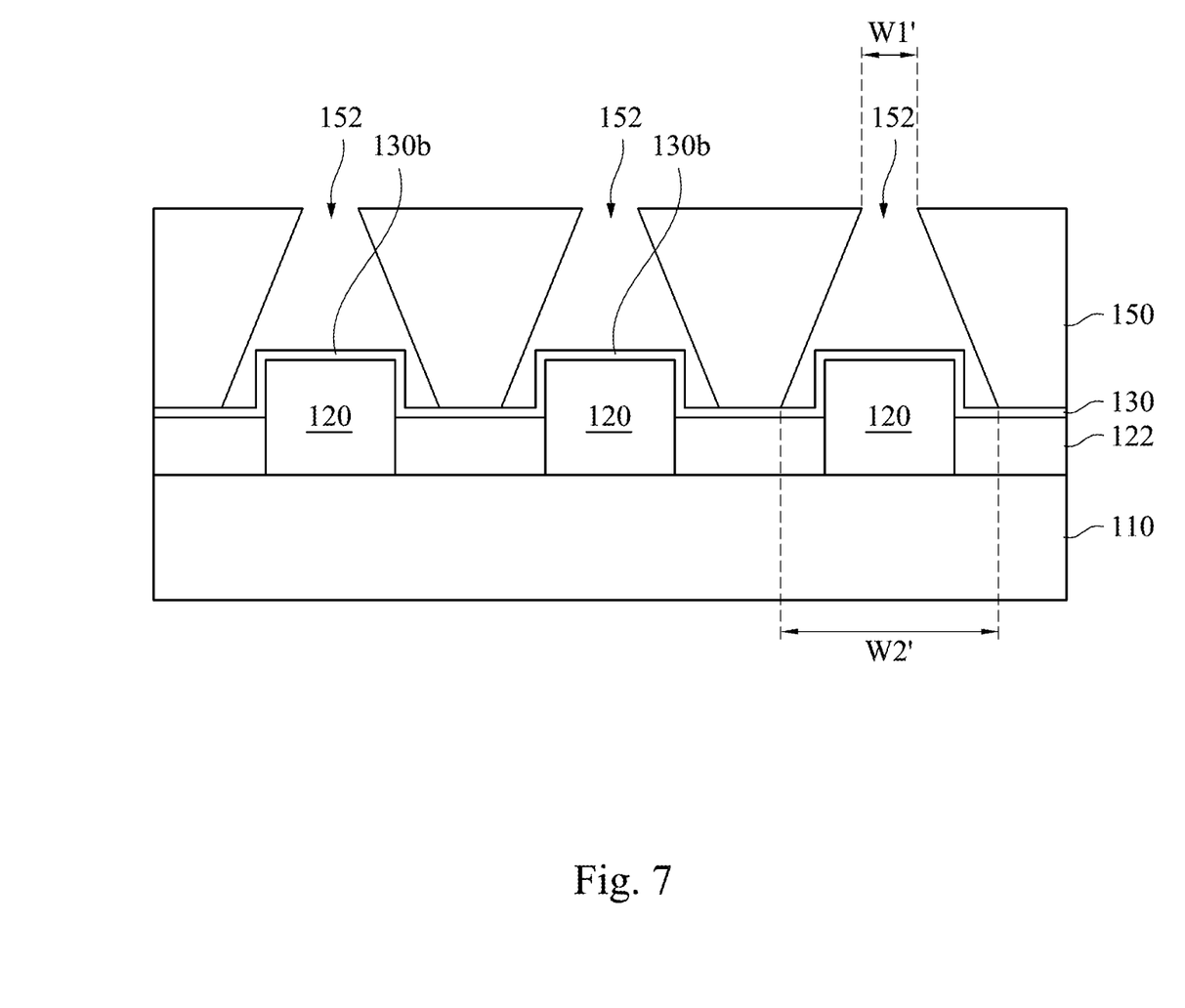

Next, referring to FIG. 1 and FIG. 7, in the operation 18 of the method 10, the mask structures 142 are removed to form a plurality of cavities 152 exposing a second portion 130b of the UBM layer 130. In some embodiments, removing the mask structures 142 includes wet etching process. For example, the mask structures 142 are removed by using hydrofluoric (HF) acid to etch from the top surface of the mask structures 142. As shown in FIG. 7, the cavities 152 have a shape substantially consistent with the mask structures 142 (shown in FIG. 6). That is, each of the cavities 152 has an entrance with a width W1' that is substantially equal to the top width W1 of the mask structures 142. Similarly, each of the cavities 152 has a bottom width W2' that is substantially equal to the bottom width W2 of the mask structures 142.

Figure 8:
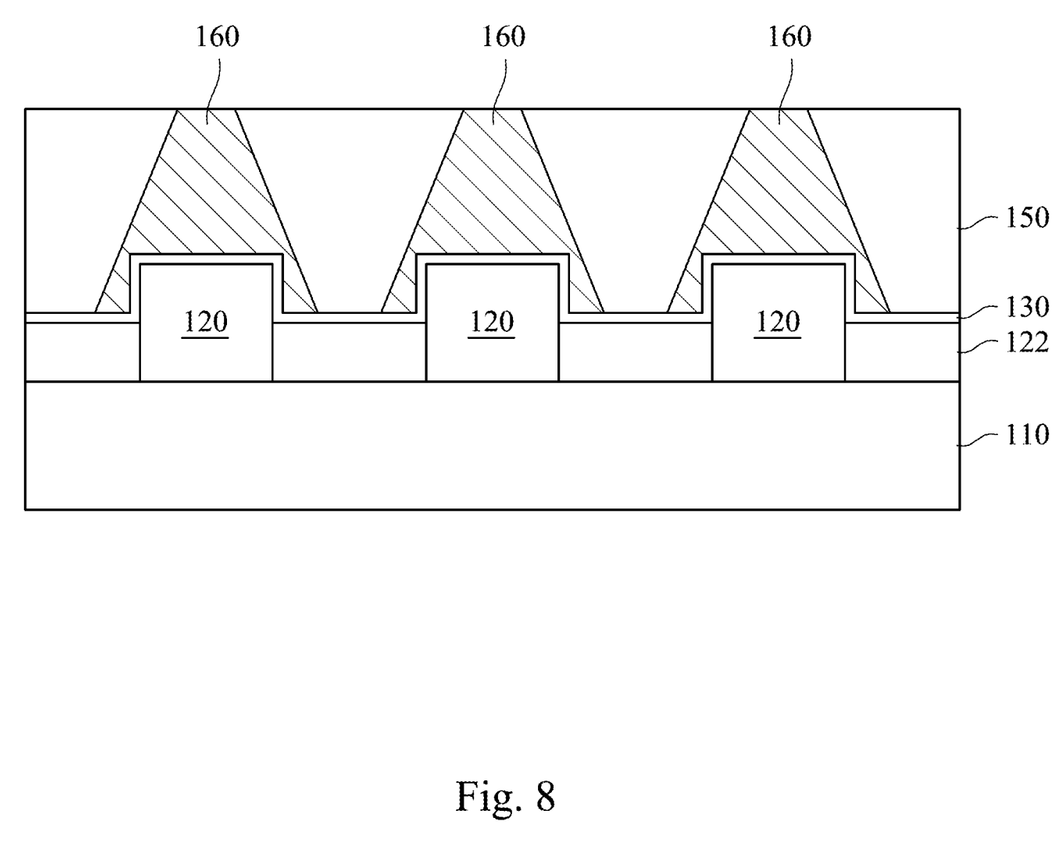

Next, referring to FIG. 1 and FIG. 8, in the operation 20 of the method 10, a conductive material layer 160 is formed in the cavities 152. Specifically, the conductive material layer 160 is formed on the exposed second portion 130b (shown in FIG. 7) of the UBM layer 130. In some embodiments, the conductive material layer 160 is formed in the cavities 152 by performing an electrochemical deposition process. In some embodiments, the conductive material layer 160 includes copper (Cu), but is not limited thereto.

Figure 9:
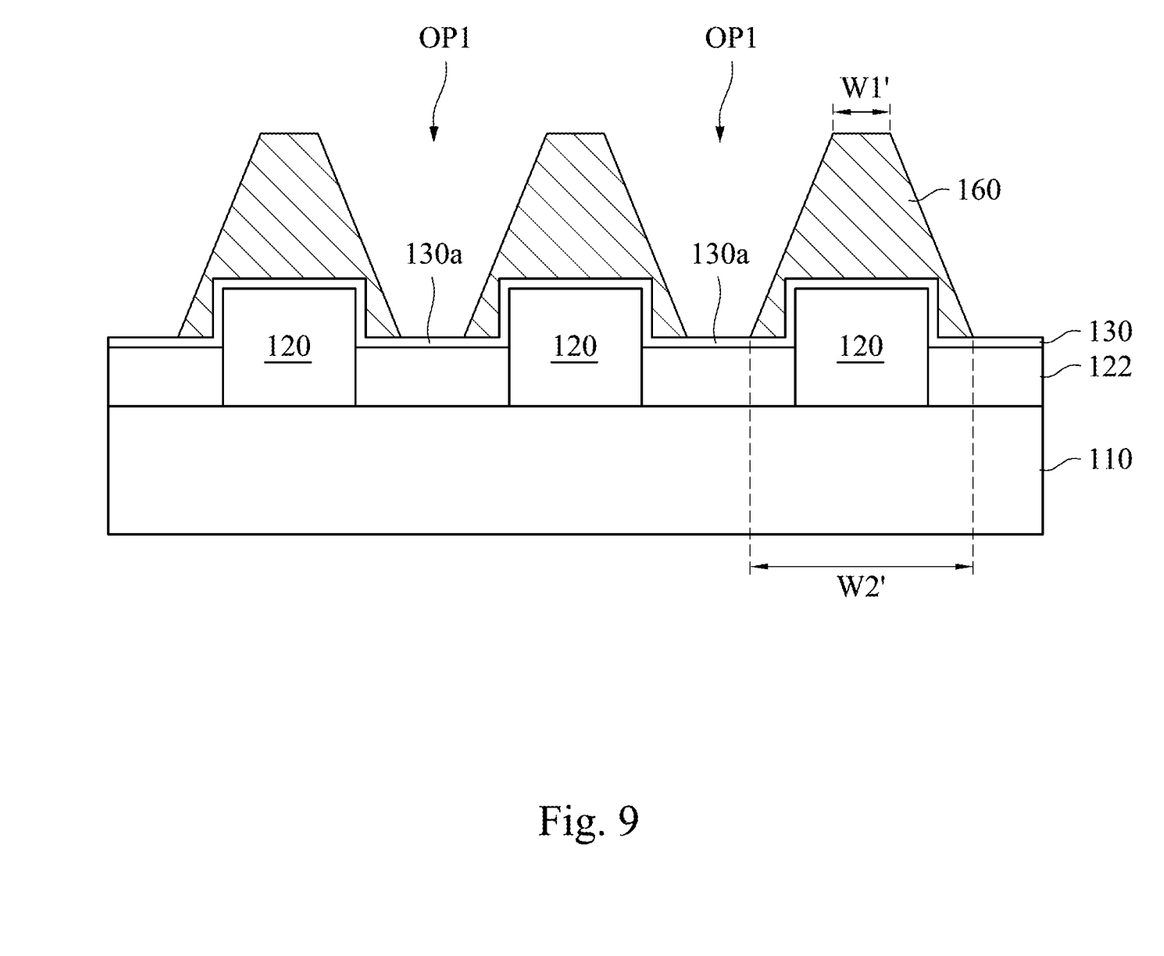

Next, referring to FIG. 1 and FIG. 9, in the operation 22 of the method 10, the supporting layer 150 is removed. Specifically, the supporting layer 150 is stripped to expose the first portion 130a of the UBM layer 130. As shown in FIG. 9, the conductive material layer 160 is retained on the UBM layer 130 and separated from each other by the opening OP1. The conductive material layer 160 has a shape inherited from the mask structures 142 and the cavities 152. Therefore, the shape of the conductive material layer 160 is substantially equal to the mask structures 142 and the cavities 152. Specifically, the conductive material layer 160 has a top width W1' and a bottom width W2'.

Figure 10:
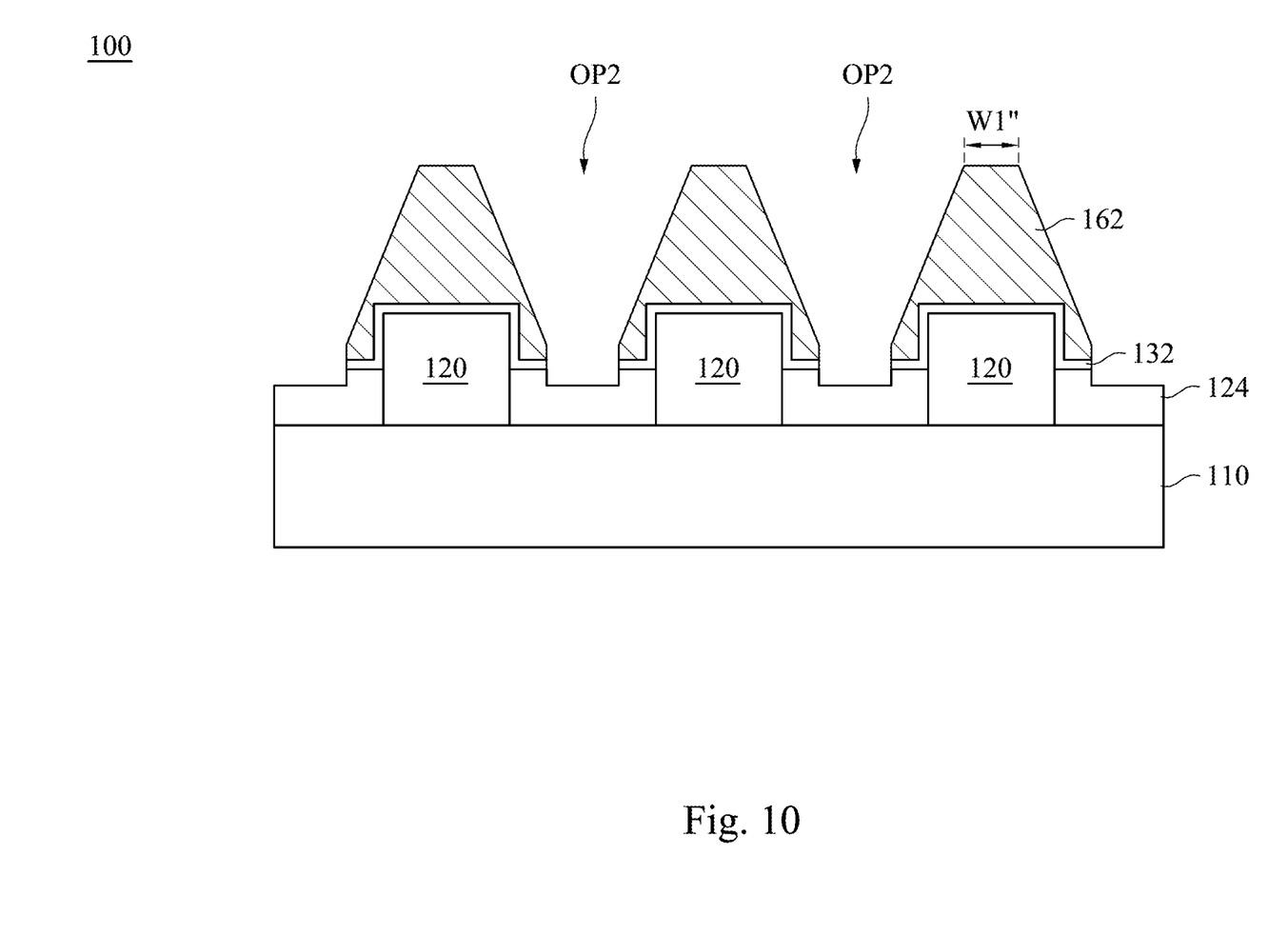

Next, referring to FIG. 1 and FIG. 10, in the operation 24 of the method 10, the first portion 130a of the UBM layer 130 is removed to form a plurality of conductive bumps 162 separated from each other. The first portion 130a of the UBM layer 130 may be stripped by suitable etching process, and the etching process may be stop on the etch stop layer 122. Specifically, the first portion 130a of the UBM layer 130 is removed to form UBM layer 132. Therefore, the semiconductor structure 100 having a plurality of individual conductive bumps 162 is formed. In some embodiments, each of the conductive bumps 162 covers one of the conductive pads 120. As shown in FIG. 10, each of the conductive bumps 162 is aligned with a conductive pad 120. The conductive pads 120 are electrically insulated from each other by the openings OP2. The conductive bumps 162 are electrically connected to the corresponding conductive pads 120 through the UBM layer 130 between thereof. The conductive bumps 162 have a shape that is similar to the conductive material layer 160, the mask structures 142 and the cavities 152. That is, a top width W1" of the conductive bumps 162 is substantially equal to the top width W1 and W1'. In some embodiments, each of the conductive bumps 162 has a cone shape structure or a pyramid shape structure, but is not limited thereto. In some embodiments, the etch stop layer 122 under the first portion of the UBM layer 130 is further removed when removing the first portion 130a of the UBM layer 130. In some embodiments, the conductive material layer 160 on the first portion 130a of the UBM layer 130 is further removed when removing the first portion 130a of the UBM layer 130. The conductive bumps 162 may be jointed with conductive pads 120 and/or conductive bumps 162 on other semiconductor structure.

It is noted that the processes and operations described above are illustrated for examples only, and each operation can be arbitrarily changed according to the requirements. In some embodiments, additional operations can be performed before, during or after the process above.

As described above, according to the embodiments of the present disclosure, a method of manufacturing a semiconductor structure is provided. The method disclosed herein forming a plurality of conductive bumps having a cone shape structure on a substrate. The cone shape conductive bumps can be easily formed by forming a plurality of cone shape mask structures through the HDP process. Specifically, a supporting layer is filled in the openings between the cone shape mask structures. The cone shape mask structures are then removed to form a plurality of cavities in the supporting layer which functions as a mold to form the cone shape conductive bumps. The cone shape conductive bumps are then formed by an electrochemical deposition process. The cone shape conductive bumps have a small top surface area, such that a joint area between the conductive bumps and conductive pads of other semiconductor structure (e.g., chip) can be reduced. Further, the bump joint process can be performed with low temperature and low load force. Therefore, damages and cracks of the chips can be prevented during the bump joint process.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of manufacturing a semiconductor structure, comprising:
    forming a precursor structure comprising:
        a substrate;
        a plurality of conductive pads on the substrate;
        an etch stop layer between the conductive pads; and
        an UBM layer on the conductive pads and the etch stop layer;
    forming a plurality of mask structures on the UBM layer and a plurality of openings between thereof, wherein each of the mask structures is located on one of the conductive pads, and the openings expose a first portion of the UBM layer;
    forming a supporting layer in the openings;
    removing the mask structures to form a plurality of cavities exposing a second portion of the UBM layer;
    forming a conductive material layer in the cavities;
    removing the supporting layer; and
    removing the first portion of the UBM layer to form a plurality of conductive bumps separated from each other.

2. The method of claim 1, wherein the mask structures comprises oxide material.

3. The method of claim 1, wherein forming the mask structures comprises performing High Density Plasma (HDP) process.

4. The method of claim 1, wherein each of the mask structures has a top width and a bottom width that is greater than the top width.

5. The method of claim 1, wherein each of the mask structures has a sharp end.

6. The method of claim 1, further comprising removing a top portion of each of the mask structures.

7. The method of claim 1, wherein the supporting layer comprises polymer material.

8. The method of claim 1, wherein removing the mask structures comprises wet etching process.

9. The method of claim 1, wherein each of the conductive bumps covers one of the conductive pads.

10. The method of claim 1, wherein each of the conductive bumps has a cone shape structure or a pyramid shape structure.

* * * * *